United States Patent [19]

Iyer et al.

[11] Patent Number: 5,270,712
[45] Date of Patent: Dec. 14, 1993

[54] SORT ORDER PRESERVING METHOD FOR DATA STORAGE COMPRESSION

[75] Inventors: Balakrishna R. Iyer, Mountain View; Glen G. Langdon, Jr., Aptos; Ahmad Zandi, Santa Cruz, all of Calif.

[73] Assignee: International Business Machines Corporation, Armonk, N.Y.

[21] Appl. No.: 862,159

[22] Filed: Apr. 2, 1992

[51] Int. Cl.$^5$ .............................................. H03M 7/00
[52] U.S. Cl. ...................................... 341/50; 341/67; 364/DIG. 2; 364/962.3; 395/425
[58] Field of Search ................... 341/50, 67; 395/425, 395/600

[56] References Cited

U.S. PATENT DOCUMENTS

| | | | |
|---|---|---|---|
| 3,593,309 | 7/1971 | Clark et al. | 340/172.5 |
| 3,602,895 | 8/1971 | Loizides | 340/172.5 |
| 3,613,086 | 10/1971 | Loizides et al. | 340/172.5 |
| 4,386,416 | 5/1983 | Giltner et al. | 364/900 |
| 4,464,650 | 8/1984 | Eastman et al. | 340/347 |
| 4,782,325 | 11/1988 | Jeppsson et al. | 341/55 |
| 4,914,569 | 4/1990 | Levine et al. | 364/200 |
| 5,001,477 | 3/1991 | Hicks et al. | 341/50 |
| 5,123,104 | 6/1992 | Levine et al. | 395/600 |

OTHER PUBLICATIONS

Information Theory by Masud Mansuripur; 1987; Preintice-Hall Inc.; pp. 25-35; "Variable-Length Source Coding".
Compression of Indiviudal Sequences via Variable--Rate Coding by Jacob Ziv; IEEE; Sep. 1988; pp. 530-536; vol. IT-24(5).
A Note on the ZIV-Lempel Model for the Compression of Indiv. Sequences; IEEE; Mar. 1983; pp. 284-287; vol. IT-29(2).
A Technique for High-Performance Compression; Computer (Jun. 1984); pp. 8-19; by Terry A. Welch.
Compression Sort Keys While Maintaining Sort Sequences; pp. 388-391 D. R. Hicks; IBM Tech. Disclosure Bulliten vol. 26 No. 1 (Jun. 1983).
Optimized Key Compression; IBM Tech. Disclosure Bulletin; by P. Franaszek; vol. 16, No. 10 (Mar. 1974); pp. 3466-3470.

*Primary Examiner*—Howard L. Williams
*Attorney, Agent, or Firm*—Baker, Maxham, Jester & Meador

[57] ABSTRACT

A method for data compression of records in storage that offers the decoding speed of Variable-to-Fixed codes without loss of sort order characteristics when stored in coded form. The methods include special treatment of the first ordered symbols in both source and decoder alphabets and do not depend on the use of prefix or arithmetic codes for their efficacy. The method saves database storage space by compressing actual records without loss of record sort order characteristics. The lexical ordering or "strong alphabetical" property of the encoding technique are left undisturbed by EOR codes and code-string terminations for byte-padding purposes because both EOR and code-string termination is accomplished with a zero-valued code word. This maintains record order through a proper magnitude relationship between the corresponding encoded records even if one record compresses to a different length than another.

7 Claims, 3 Drawing Sheets

SORT ORDER PRESERVING METHOD FOR DATA STORAGE COMPRESSION

BACKGROUND OF THE INVENTION

1. Field of the Invention

This invention relates to procedures for storage and transfer of data in computer systems, and more particularly, to a method for extended alphabet data compression that decodes efficiently and preserves sort order in compressed form.

2. Description of the Related Art

Variable-length source coding is a well-known solution to the problems known for fixed-block data compression techniques, including large dictionary memory and extensive search requirements. The application of variable-length source coding methods to data storage compression leads to two new problems that do not concern practitioners in the data channel compression arts. These are (a) the loss of sort order among the stored records following compression, and (b) the code string termination problem, which relates to designation of record boundaries and the requirement to terminate strings at byte boundaries in byte-oriented storage systems.

The fundamental features of variable-length source coding are set forth by R. G. Gallager, "Information Theory and Reliable Communications", John Wiley and Sons, New York, 1968. Also, reference is made to Masud Mansuripur, "Information Theory", Prentice-Hall, Inc., Inglewood Cliffs, N.J., 1987, pp. 25-35. The general solution to the sort-order problem of compressed records in a storage resource has not heretofore been found, particularly because of the difficulties inherent in the code string termination requirement for padding the encoded record in a byte-oriented storage resource. Because there is little interest in the sort order of data in compressed form during transmission through a channel, little attention is given to this problem by practitioners in the data transmission art.

An alphabet is defined in the art as a set of symbols, e.g., the eight-bit per symbol EBCDIC alphabet. Some variable-length source coding techniques employ a form of source alphabet extension, which is a technique for extending a source alphabet to include "words" composed of more than one symbol from the source alphabet. The elements of the extended source alphabet or source words can be assigned code elements or code words related to the relative frequencies of the respective source words. This coding technique involves first "parsing" a string of source symbols into "words" of one or more symbols and then "encoding" each source word by substituting the corresponding code word. Extended source alphabets offer a speed advantage. Decoding is also relatively fast because a plurality of source symbols are decoded for each code word.

Extended source alphabets also provide the opportunity for additional compression through the use of higher-order symbol dependencies. A simple example of an extended alphabet is the "3-gram" block method proposed by Claude Shannon (see Shannon et al. "The Mathematical Theory of Communication", University of Illinois Press, Urbana (1964)). Another general example is the dictionary approach. In the prior art, a dictionary is a collection of words referenced by a "greedy parser", which determines in one pass the longest word in the dictionary corresponding to the next portion of a source string or record to be compressed by encoding. Practitioners have also developed techniques using "non-greedy" optimal parsers for a data string that can be parsed more than one way. Each word in such a dictionary is assigned an index and the dictionary is shared between the encoder and decoder processes.

An important form of variable-length source coding is known in the art as Variable-to-Fixed (V-to-F) coding. In V-to-F coding, a variable-length set of $2^k$ source words is mapped to the set of fixed-length k-bit numbers. Because there are $2^k$ such k-bit numbers, the dictionary approach becomes V-to-F coding if each dictionary index is a k-bit binary code word. As is well-known, the best compression in V-to-F coding occurs when the source word probabilities are equal; that is, when the probability of each word approaches the ideal value of $2^{-k}$. The corresponding code words can be decoded rapidly because the fixed-length k-bit code word serves as an index that retrieves from a table (dictionary) the variable-length source string that was encoded. These compression techniques also achieve some of the compression advantage of higher-order Markov techniques when the data string is actually a concatenation of source words.

An adaptive form of V-to-F encoding is the Ziv-Lempel technique described by J. Ziv et al. "Compression of Individual Sequences Via Variable-Rate Coding", *IEEE Trans.*, (Vol. IT-24(5), pp. 530-536, September 1978). Reference is also made to the analysis of the Ziv-Lempel code compression capabilities provided by G. Langdon "A Note on the Ziv-Lempel Model for the Compression of Individual Sequences", *IEEE Trans. Information Theory*, Vol. IT-29(2), (March 1983). For a discussion of the popular "LZW" version of the Ziv-Lempel code, reference is made to T. Welsh, "A Technique for High-Performance Compression", *Computer*, June 1984, pp. 8-19.

In U.S. Pat. No. 4,464,650, W. L. Eastman et al. disclose an improved "LZW" version of the Ziv-Lempel compression algorithm wherein the source string is parsed into adaptively growing segments, each segment consisting of an exact copy of an earlier portion of the source string suffixed by one new symbol from the source string. The copy that is to be made is the longest possible and is constrained to coincide with an earlier parsed segment. By this method, a dictionary is "grown" in response to the source string characteristics, adaptively. Eastman et al. provide extensive discussion of an incomplete parse-tree encoding method and their patent is included herein in its entirety by this reference.

In the general dictionary approach, each symbol alphabet dictionary can be described as a "parse-tree", such as the tree shown in FIG. 1. To recognize the next dictionary word from a source string of source symbols, the parse-tree is entered at the root node and the path to the child of the root node having the first source symbol is taken. Next, if the second source symbol in the string matches a child symbol that is subtended from the current node corresponding to the first symbol, the path to the child node having the second symbol is traversed and this new node becomes the current node. At some point, a current node is reached that is either a leaf node, defined as a node without children, or is an interior node having some children but lacking a child node assigned the next source symbol in the string. At this point, the current node corresponds to the end of the longest word in the source string that is present in the source "dictionary". This node is assigned a code word from a code word dictionary. If this end node is not a leaf node, the parse-tree is said to be "incomplete" (e.g. FIG. 2).

If each interior node of the parse-tree has all source symbols as children, then the parse-tree is said to be "full" (e.g. FIG. 1). In a full parse-tree, all parsing operations terminate at a leaf node unless the end of the source string is first attained. Thus, the code word dictionary corresponding to a full parse-tree contains only leaf node code words. No code word in this dictionary is the prefix of another code word in the same dictionary. Any coding scheme having this absence of prefixes is referred to as a "prefix code".

Unfortunately, in the general case, the parse-tree has some interior nodes that are limited only to the most popular children and therefore the parse-tree is said to be "incomplete". Many important dictionary techniques, including the Ziv-Lempel compression method, result in incomplete parse-trees because adding all source symbols at each generation is unnecessarily expensive. The majority of these source symbols occur infrequently and the paths to their assigned nodes are seldom used. The infrequently used children nodes are omitted to permit efficient dictionary storage and rapid decompression of code words.

An "alphabetical" order can be postulated for any symbol alphabet and such order extends to any extended alphabet that represents the leaves of a full parse-tree. The leaves of a full parse-tree have an alphabetical or "sort" order according to the order of the corresponding symbol alphabet. A first approach to order-preserving codes may be found by referring to Gilbert et al., Bell System Technical Journal, 1959, pp. 933–967. Gilbert et al discuss "alphabetical-order encodings" having a "strong alphabetical" property where the source record order is preserved as the numerical order of their binary codes. Although an order-preserving encoding technique limited to full parse-trees can be deduced from the methods known to practitioners in the art (except for source words formed by EOR source string truncations), an efficient coding technique that preserves the sort order of source records in encoded form for incomplete parse-tree dictionary coding methods is unknown.

Much of the relevant prior art concerns methods for the compression of search keys, search indexes and pointer tables designed to point to the actual source record of interest. Such compressed indexes do nothing to preserve sort order in a file of compressed records. Indeed, in U.S. Pat. No. 3,651,483, W. A. Clark et al. disclose the use of a compressed index for pointing to an uncompressed record. That is, the actual records are never compressed.

W. A. Clark et al. also discuss the generation of compressed keys in U.S. Pat. No. 3,593,309 and E. Loizides teaches a similar compressed index method in U.S. Pat. Nos. 3,602,895 and 3,613,086. These teachings do not sort the compressed keys in terms of their lexical value. The compression techniques also do not consider the probability distribution of the keys but merely use shortened representations of each index obtained by dropping the prefix or higher-order portion of the index pointer in groups of adjacent indexes having identical higher-order terms.

In U.S. Pat. No. 4,782,325, Hakan Jeppsson et al. teach a key encoding method that reduces the redundancy ratio of the encoded key set. This again considers only keys and does not teach any method for compressing the actual records, which must be sorted in uncompressed form. Jeppson et al. use a Huffman code to generate a code word dictionary, thereby reducing the redundancy ratio by optimizing the encoding procedure.

In U.S. Pat. No. 4,386,416, Michael E. Giltner et al. teach a data compression method suitable for use in data transmission over a standard network. Giltner et al. also suggest the Huffman code for optimal dictionary generation and base their binary sequences on escape codes. Neither Jeppson et al. nor Giltner et al. consider the problem of sort ordering of records in encoded form.

Reference is also made to D. R. Hicks, "Compressing Sort Keys While Maintaining Sort Sequence", IBM Technical Disclosure Bulletin, Vol. 26, No. 1, June 1983, pp. 388–391. Hicks discloses a compression method that retains a sort-order property for a set of sort keys but teaches the use of run-length encoding of like source characters. This encoding method merely replaces a sequence of two or more repeated characters with two occurrences of the repeated character followed a count of the repetitions. Hicks neither teaches nor suggests how to use the more powerful adaptive V-to-F encoding method discussed above while preserving source record sort order in compressed form.

Reference is made to P. Franaszek, "Optimized Key Compression", IBM Technical Disclosure Bulletin, Vol. 16, No. 10, March 1974, pp. 3466–3470. Franaszek teaches a powerful key-compression algorithm based on a parsing tree wherein, at each internal node, a mechanism is provided for locating the sub-tree containing the key being searched. However, Franaszek's method does not preserve sort order following compression.

Thus, the powerful and effective compression methods known in the art that rely on incomplete parse-trees do not preserve sort order. Such order preserving techniques for data compression that are known in the art are relatively ineffective for preserving storage space. Accordingly, there is a clearly felt need in the art for a data compression method that combines the efficient compression features of V-to-F codes using incomplete parse trees with the source record order preserving features available from full parse-tree dictionary encoding techniques.

The unresolved problems and deficiencies related to incomplete parse-tree dictionary encoding data compression methods are clearly felt in the data storage arts and are solved by the present invention in the manner described below.

SUMMARY OF THE INVENTION

It is an object of this invention to obtain the rapid decoding speed of V-to-F codes while maintaining sort order and efficient dictionary storage. This object is accomplished by means of an order-preserving code that uses an incomplete parse-tree and by incorporating a special EOR definition for a new symbol that is added to the source alphabet as the first ordered symbol.

It is another object of this invention to provide means for determining the end of a record so that the encoder and decoder processes can halt at the end of a record while preserving the sort order of records that end with a string of the first symbol in the source alphabet. This object is obtained by assigning the first position in the encoder alphabet to a code word of least (zero) value. This symbol is reserved as a special End-of-Record (EOR) symbol to ensure proper code string termination and to obtain the "strong alphabetical" compression property that preserves source word and record sort order in compressed form. Other symbols are assigned code words having values according to the ordering sequence.

The methods of this invention are general and do not depend on the use of prefix codes or arithmetic codes. If an arithmetic code is employed, then the source words represented by the incomplete parse-tree nodes may be encoded and decoded either in one step or else decomposed into a sequence of steps where each step includes a traversal from a parent node to a child node.

The incomplete parse-tree approach of this invention enhances decoding speed and, includes a method for identifying interior nodes having missing children as encoded items. The marker leaf node (or the Zilch symbol) is introduced as a code word place holder. This technique does not convert an incomplete parse-tree to a full parse-tree but is instead an economical compromise that obtains the "strong alphabetical" property of a full parse-tree without losing the adaptive dictionary storage properties of a partial tree. Code word assignments are limited to leaf nodes and marker leaf nodes. No interior nodes need be associated with a code word using the method of this invention, even with such fragments as may result from an input string termination.

The foregoing, together with other features and advantages of this inventions will become more apparent when referring to the following specifications, claims and the accompanying drawings.

BRIEF DESCRIPTION OF THE DRAWINGS

For a more complete understanding of this invention, reference is now made to the following detailed description of the embodiments illustrated in the accompanying drawings, wherein.

DESCRIPTION OF THE PREFERRED EMBODIMENTS

The Order-Preserving Coding Concept

Figure 2:
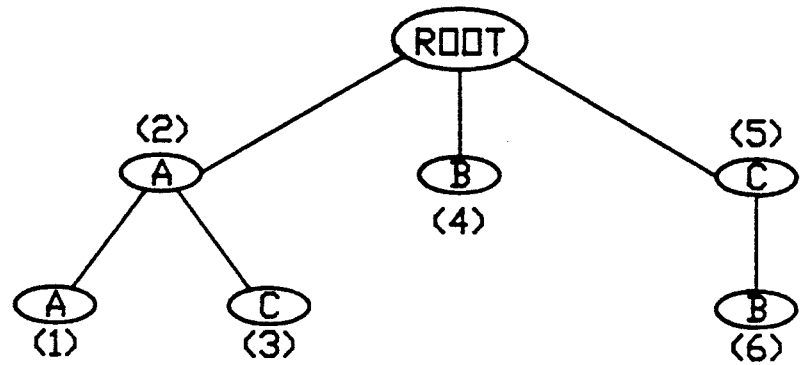
FIG. 2 shows an incomplete parse-tree based on the Ziv-Lempel code from the prior art for a 3-symbol alphabet.

In the Gilbert et al reference cited above, an algorithm is disclosed that, for a given alphabet, generates a set of code words for alphabetic-order encoding that provide equal or better compression than any other alphabetical-order preserving prefix code. They prefer a prefix code because it guarantees unambiguous decoding of the next encoded item immediately upon viewing the next code word. This is possible because no code word in the set is the prefix of another code word in the same set. In contrast, a fixed-length twelve-bit arithmetic decoder must see all twelve subsequent code string symbols to decode the next source symbol, independent of the coding probability of that source symbol. To appreciate the implication of their algorithm, Gilbert et al present the coding example contained in Table 1 below.

TABLE 1

| Symbol | Probability | Prefix Code 1 | Non-Prefix Code 2 |
|---|---|---|---|
| A* | .330 | 000* | 00* |
| B | .005 | 001 | 001 |
| C | .330 | 01 | 10 |
| D | .005 | 10 | 101 |
| E | .330 | 11 | 11 |

*first symbol in ordering

Considering Table 1, note that Code 1 has the prefix property. Code 2 does not because, for instance, the code for A is a prefix to the code for B, and the code for C is a prefix for the code for D. Also, Code 2 has "infinite delay" because the code string 001111 ... cannot not be unambiguously decoded. Finally, in the Gilbert et al algorithm, unless the code string 0000000 ... 0 is a never-used code word, it must be assigned to the first symbol in the source alphabet (A in Table 1).

In Table 1, Code 2 provides more efficient data compression because the longer codes are assigned to the source symbols having the lower occurrence probabilities. Thus, the weighted code word length for code 2 is 2.03 code bits per source symbol, compared with 2.358 code bits per source symbol for Code 1. Thus, the advantageous prefix property of Code 1 is purchased with a significant reduction in compression efficiency over Code 2.

Both Codes 1 and 2 preserve the alphabetical order of individual source symbols but Code 2 does not preserve the alphabetical ordering of words made up of individual source symbols. For example, CE codes to 1011, which is larger than the 10100 code word for source word DA. Gilbert et al have shown that any prefix code that retains the sort order of the source symbols will also retain the sort order of words composed of such source symbols. They refer to this characteristic as the "strong alphabetical" property of the prefix code. A code having the "strong alphabetical" property will provide code words with magnitude ordering identical to the alphabetical ordering of the corresponding source words. Thus, in Table 1, Code 1 has the "strong alphabetical" property and Code 2 has a weaker alphabetical property that merely preserves the alphabetical ordering of the individual source symbols as the numerical value of the binary code.

Although Gilbert et al maintain a code magnitude order identical to the sort order (anticipating this same property later discovered for arithmetic codes), their algorithm does not provide optimal compression in the manner of a Huffman code. This is clearly evident in the example in Table 1 where Code 1 requires 16.7% more code bits on the average than does Code 2. Thus, when using prefix coding, there are many examples where coding efficiency relative to Huffman codes must be sacrificed to gain the "strong alphabetical" property of a prefix code.

Arithmetic coding provides a better approach to order-preserving codes. This can be appreciated by referring to R. Pasco, "Source Coding Algorithms for Fast Data Compression", Ph.D. Thesis, Department of E. E., Stanford University, California, May 1976. Arithmetic coding operates to encode source strings in a magnitude order corresponding to the order of the source symbols used in the cumulative probability calculation that generated the arithmetic code. Moreover, a simple integer-length arithmetic coding analog to the Huffman code, having the same compression efficiency as an optimal prefix code, can be defined in the manner disclosed by Pasco. Thus, the arithmetic code of Pasco may improve the compression inefficiencies noted for the Gilbert et al scheme.

Barriers to the "Strong Alphabetical" Property in Prefix Codes

Several problems contribute to the difficulty in retaining a "strong alphabetical" property in a prefix coding scheme. For instance, consider the full parse-tree in FIG. 1. At the first level, three intermediate nodes are provided, one for each letter in the alphabet. At the second level, three leaf nodes are provided as children of each of the three intermediate nodes. The code word assignments are shown as numerals (n) at each of the leaf nodes. No code words are required at the interior nodes.

Figure 1:
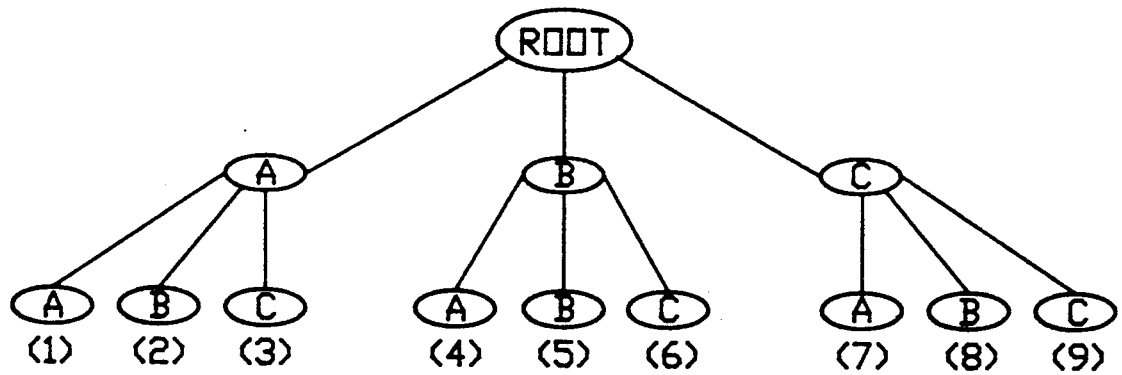
FIG. 1 shows a full parse-tree for a 3-symbol source alphabet from the prior art.

In the normal course of encoding a source string, the word assignment shown in FIG. 1 will suffice. However, a special problem occurs when a source string terminates, such as at the end of a record. If, for instance, a record contains the string ABCAACB, the tree in FIG. 1 would encode as 273B, where the last symbol represents the intermediate node B for which no code word has been assigned. Until now, this problem was resolved by assigning code words to all intermediate nodes as well as all leaf nodes, which is inefficient. Until now, a method for implementing parse-trees without code word assignments to intermediate nodes was unknown in the art.

Another problem involves the use of atomic units of storage for database records, whether compressed or not. This atomic unit of storage is usually the 8-bit byte because record length is measured and organized in bytes. Because the compressed record is of variable length in bits (a variable number of fixed length code words), the end of the code string may sometimes fall intermediate to the interval byte boundaries. When this occurs, "padding" bits must be added to round the last code string bits to complete an interval byte. This padding requirement introduces an additional problem in maintaining the "strong alphabetical" property of an encoded string.

These additional padding bits also, for both prefix and arithmetic codes, raise the record-termination problem of knowing when the last code word of the record has been decoded. One solution to this problem is to provide each record with its length in symbols and stop decoding when the proper number of symbols has been produced. Another solution is to provide a special EOR marker code word at the end of each record (See, for example, Witten et al, "Arithmetic Coding for Data Compression", *Communications of the ACM*, 1987). Until now, neither of these solutions has been implemented in a manner that preserves the "strong alphabetical" property of the code.

These problems are referred to herein as the interior node EOR problem and the byte-padding problem. Both problems affect either full or partial parse-tree coding efficiency. Only the interior node EOR problem can be (inefficiently) overcome, without this invention, to preserve the "strong alphabetical" property.

A Solution for the Interior Node EOR Problem

Except for the interior node EOR problem and the byte-padding problem discussed above in connection with FIG. 1, the "strong alphabetical" property for a prefix code compression scheme can be guaranteed by merely completing the incomplete parse-tree; that is, by adding to the tree in FIG. 2 those missing nodes shown in FIG. 1. If the parse-tree is filled, then the set of leaf nodes corresponds to a set of source words that can be parsed and treated as an extended source alphabet with the obvious sort order. If the leaves are encoded with a sort-order preserving prefix code, then any words formed by concatenation of these leaf nodes retain the source word sort order in their coded form as proven by Gilbert et al in the above reference. Unfortunately, in general, an EOR may force even a full parse-tree to terminate at an interior node, forcing the assignment of additional code words to all interior nodes.

A useful method for telling a decoder to end decoding the record is to count the source symbols in the original record and decrement a counter for each decoded symbol, stopping when the counter reaches zero. Another useful method is to create a fictitious EOR source symbol that, when decoded, tells the decoder to halt. In the case of a prefix code or an arithmetic code having the "strong alphabetical" property, the encoding of such an EOR symbol must add no magnitude to the resulting code word. The following example illustrates this point. If a source word to be encoded is shorter than another source word, then the shorter source word should have the lesser value when encoded so that the shorter source word sorts in front of the longer. Consider two records identical except that the first ends in more repetitions of the first-ordered source alphabet symbol than the second. If both records are terminated with the EOR symbol and this EOR symbol position in the source alphabet is below the first-ordered source alphabet symbol, the longer first word will sort ahead of the shorter second word, which is the opposite effect required. To avoid this result, the EOR symbol must be associated with a code word having zero value. If the shorter second source word is extended by a symbol having zero value, then it retains the smaller magnitude relative to longer first word after coding.

Figure 3:
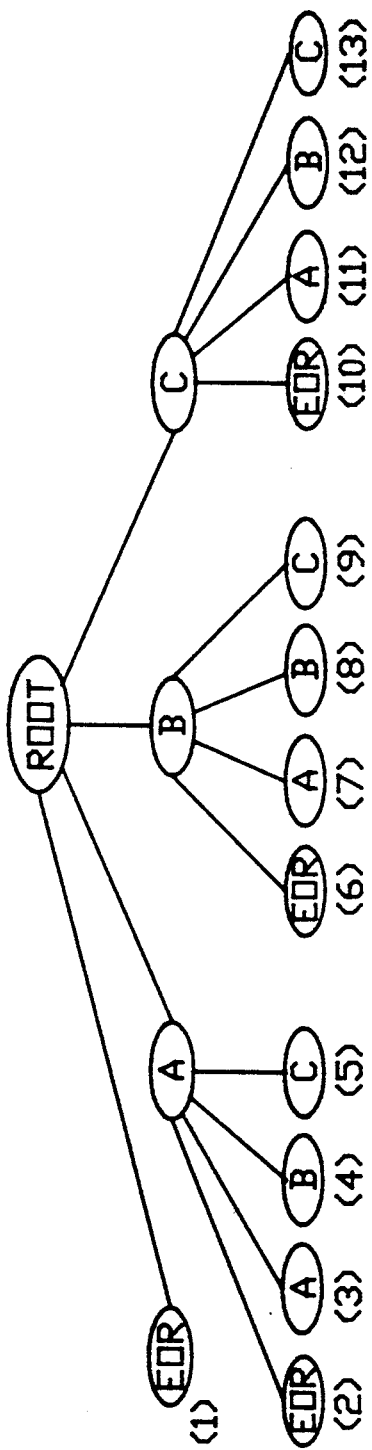
FIG. 3 shows the full parse tree of FIG. 1 augmented with EOR leaf nodes in accordance with a method of this invention.

The interior node EOR problem is thus solved in this invention by the addition of an EOR symbol as the first symbol of the source alphabet. FIG. 3 shows a full parse-tree with such an additional EOR child node at each level. This scheme is useful in two ways. First, it avoids the interior node EOR problem in full parse-trees. Secondly, adding a zero-value EOR symbol does not destroy the "strong alphabetical" property, as demonstrated above.

The parse-tree in FIG. 3, when used to encode the source string ABCAACB will yield a code string of 4, 11, 5, 6. When decoding, the decoder immediately halts upon receipt of code word (6), recognizing the EOR status. Because the parse-tree in FIG. 3 represents a prefix code, the coding scheme retains the "strong alphabetical" property discussed above.

Unfortunately, the new EOR symbol by itself does nothing to avoid the effects of the byte-padding problem on the "strong alphabetical" property of a coding scheme. Moreover, full parse-trees are inefficient compression methods that use unnecessary amounts of dictionary storage space and are not useful for implementing adaptive variable-length source coding schemes such as the Ziv-Lempel code. The EOR symbol alone fails to solve the interior node problem in an incomplete parse-tree.

A Solution for the Byte-Padding Problem

The byte-padding problem destroys the record level sort order when records are padded with bits to the byte boundaries and the length of the original record is not considered. The problem arises when a record ends with a string of the first symbol in the source alphabet. For example, consider the encoding of the EA and EAA in the prefix Code 1 shown in Table 1 above. The code for E is 11 and for A is 000. Thus, the code for EA is 11000. If this is padded to an eight-bit byte using the 1 symbol, the sort order is lost. Thus, the 0 symbol must be used for padding and the resulting padded code string is 11000000. Now, consider the code string for EAA, which is 11000000. Thus both EA and EAA are compressed to the same code word when padded to an 8-bit byte boundary. If these two coded records are sorted to a list, they will be stored adjacent to each other. Without a separate listing of the number of data symbols in each record or special EOR measures, compressed EAA could sort ahead of compressed EA, which is incorrect.

The method of this invention solves this problem by adding a new first element to the source alphabet. This new fictitious symbol is ordered lower than the original first-ordered source alphabet symbol and is accordingly assigned the code word 000 ... 0 (all 0's). Thus, in the method of this invention, the "all 0" code word cannot occur for any other source word in the remainder of the source alphabet. Accordingly, ending a record with the succession of symbols of the same type must increase the numerical value for the resulting code string, thereby avoiding the problem discussed above in connection with EA and EAA in Table 1.

In the case of an arithmetic code, the fictitious symbol of this invention is assigned to the first position in the ordering. In this manner, during the encoding procedure, the addition of a first-ordered source alphabet symbol to a source string always increases the value of the code word string and is thus not confused with one or more 0 padding bits and thereby not subject to ambiguous ordering.

Note that both the EOR symbol disclosed above and the fictitious symbol reserved for code word 000 ... 0 (all 0's) are both assigned as the first symbol in the source alphabet according to the methods of this inventions. Thus, if desired, the EOR symbol can perform double-duty; as the fictitious symbol assigned to prevent missorting of records ending with different number of first-ordered source symbols (the byte-padding problem) and as the EOR symbol which, when encoded, tells the decoder to halt upon decode of the last symbol in the record. This common assignment is the preferred embodiment of the methods of this invention. The first source alphabet symbol is defined as EOR and assigned the "all 0's" code word of whatever fixed-length is suitable. In a prefix code, only one code word will consists of all 0's, whether the code alphabet is of fixed or variable length.

The Incomplete Parse-Tree Interior-Node Problem

Variable-length source coding methods generally avoid the requirements for extensive decoding operations and a priori knowledge of source symbol occurrence probabilities. For this reason, variable-length source coding is used for adaptive data compression. The Ziv-Lempel coding technique converts variable-length strings of source symbols into fixed-length (or predictable length) strings of code symbols. The source symbol strings are dynamically selected so that all have nearly equal occurrence probabilities. Thus, strings of frequently occurring source symbols will contain more symbols than a string having infrequently occurring source symbols. This type of process is adaptive in the sense that it begins with an empty dictionary of source symbol strings and builds the dictionary or parse-tree during both the compression and decompression processes. These processes require no prior information about source data statistics and are one-pass procedures with duration proportional to the length of the source string.

Because the Ziv-Lempel encoder finds the longest "match" with a phrase already in its dictionary, it is best described as a parse-tree coding scheme. In practical implementations, available memory capacity and a requirement for storing statistics impose an upper bound on the number of leaf-nodes (words) in the encoder dictionary and the tree ceases to grow when that bound is reached.

The Ziv-Lempel code is exemplary of many useful codes known in the art that can be described in terms of incomplete parse-trees. FIG. 2 shows an incomplete parse-tree describing an arbitrary code for a 3-symbol alphabet. The tree shown in FIG. 2 is incomplete because perhaps the related Ziv-Lempel encoder has not yet processed sufficient source words to expand it into a full parse-tree. This concept can be better appreciated by referring to the Welch and Langdon references cited above, as well as to the Eastman et al U.S. Pat. No. 4,464,650.

In FIG. 2, the root node has child nodes at the first level for all symbols in the source alphabet. In this tree, both leaf and interior nodes are assigned code words, shown as a numeral (n). The first level nodes are identified in FIG. 2 by the code words (2), (4), and (5), respectively. At the next level, there are leaf nodes for symbols A and C below node (2), but no leaf node for B. Similarly, node (5) has only a single child node for B, which is a leaf node. The nodes with code words (2) and (5) are interior nodes and the remainder are leaf nodes.

The entire set of source words in the dictionary defined by the incomplete parse-tree in FIG. 2 are A, B, C, AA, AC and CB. The source data string ABCAACB would be parsed as follows: A, B, C, AA, CB. The encoded string for source string ABCAACB is 24516. Note that interior nodes (2) and (5) are sometimes required in the parsing because their children do not include a leaf node for every source symbol in the source alphabet. This is the incomplete parse-tree interior-node problem that destroys the "strong alphabetical" property of a code and cannot be remedied with an EOR character alone.

Examination of Table 2 below will confirm that there is no possible method for assigning code words to the nodes in FIG. 2 that will retain the "strong alphabetical" property. The code word assignments illustrated in FIG. 2 retain sort order for the extended alphabet (dictionary) but result in loss of sort order for longer strings of concatenated source words. Until now, no method was known in the art for protecting the "strong alphabetical" property of a coding method from the incomplete parse-tree interior-node problem.

A Solution for the Incomplete Parse-Tree Problem

A Ziv-Lempel encoder grows the necessary parse-tree dictionary in response to the source string characteristics during the encoding operation and may not encounter the source symbol sequences necessary to complete the resulting parse-tree.

Accordingly, for any adaptive variable-length source coding scheme such as the Ziv-Lempel code, the resulting dictionary can not be represented by a full parse-tree. These codes require something additional to resolve the incomplete parse-tree interior-node problem which arises whenever the "greedy parser" reaches a dead end at an interior node because of a missing child node.

The ordinary method of encoding an incomplete parse-tree does not properly handle the case of reaching an interior node and parsing a word when the next symbol is a missing child. Ordinarily, the interior node representing the source word is encoded without remembering the sort order of the missing child that causes the parser to return to the root node and begin the next word with the missing child. This can be understood by briefly referring to FIG. 2 and considering the source strings AB and AC. The parser will encode AB as 2, 4 and will encode AC as 3. The difficulty arises because the children on each side of the missing child may be in proper sort order but there is no guarantee that starting the next parse with the missing child will place the record value in between that of the children on each child. Thus, although the example in FIG. 2 maintains the proper sort order for the nodes shown, it is not possible to guarantee that the source string making up a record will retain its sort order in coded form. This results because of the inconsistent encoding of source words represented by the interior nodes.

For such incomplete parse-trees to retain alphabetical order, the code word assignments must be restricted to leaf nodes. This could be accomplished by completing the parse-tree, which is a trivial and uninteresting solution that destroys the adaptive properties of the Ziv-Lempel code. The method of this invention accomplishes the same objective by adding a fictitious Zil-symbol to the source alphabet whose role is to mark the lexical position of a group of one or more missing children. The fictitious Zil-symbol or "Zilch" can be considered as an instruction to "escape back to the root node of the parse-tree". The Zilch restores the property of the leaf nodes having an "obvious" sort order, while permitting the parse-tree to remain incomplete.

Figure 4:
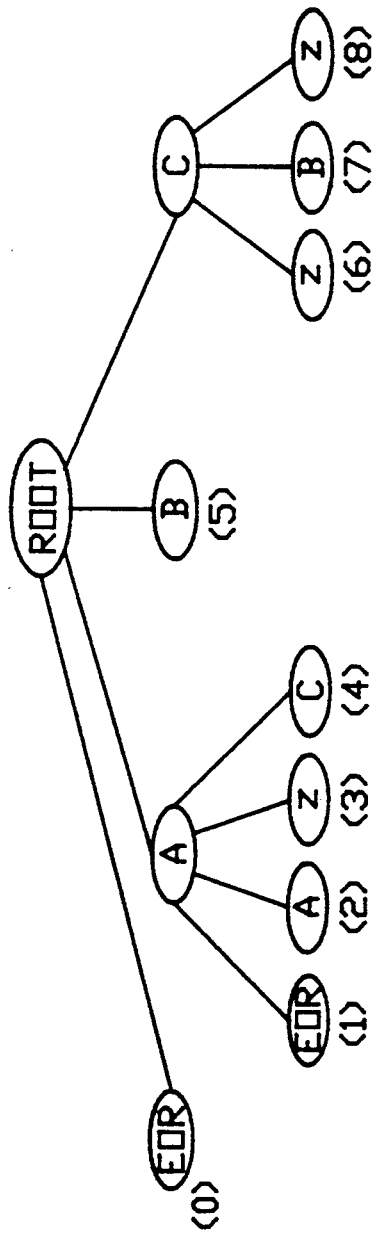
FIG. 4 shows the incomplete parse-tree of FIG. 2 augmented with the EOR and marker (Zilch) leaf nodes in accordance with the methods of this invention.
Figures 5, 6:
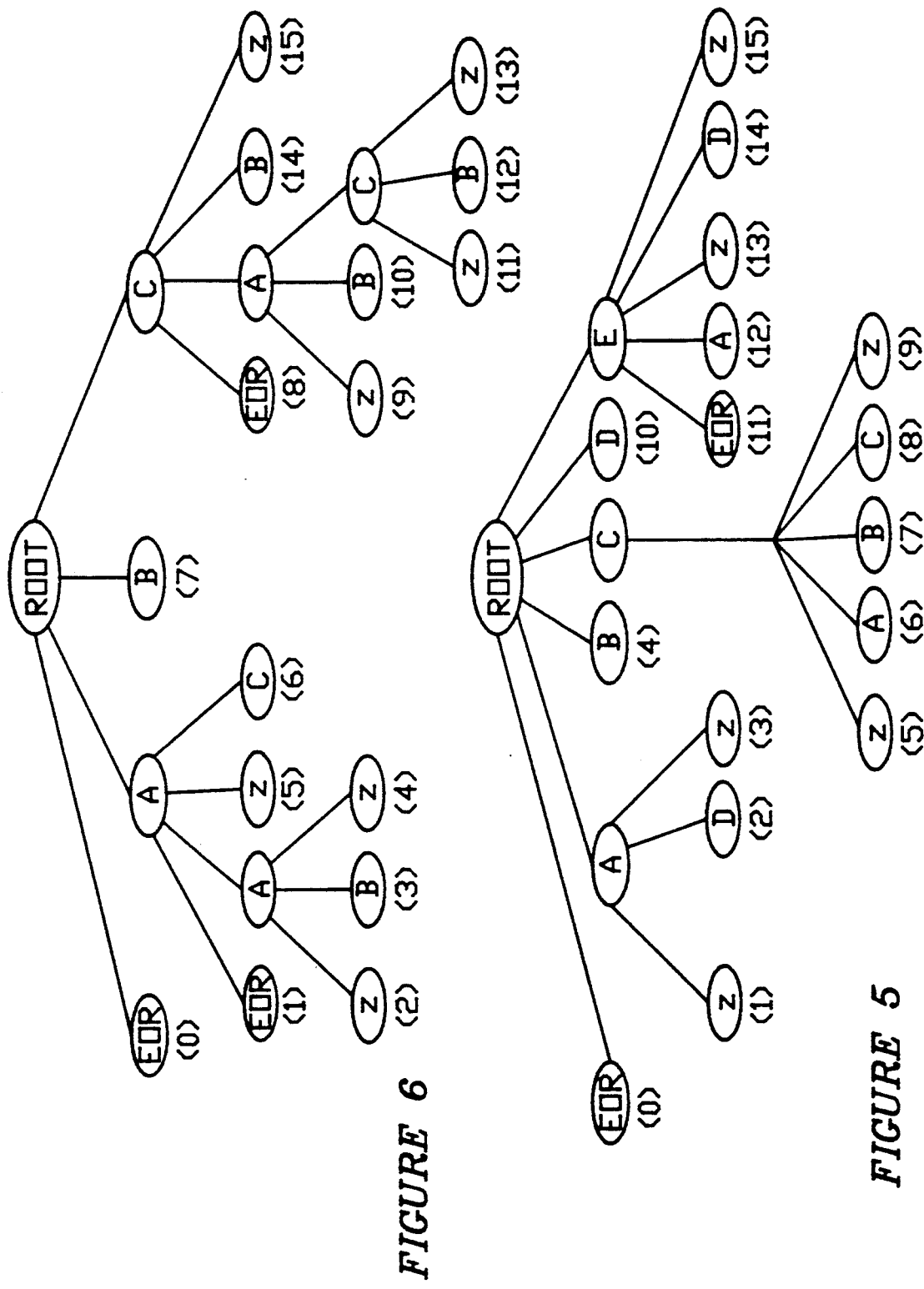
FIG. 5 shows a second example of an incomplete parse-tree augmented in accordance with the methods of this invention.
FIG. 6 shows a third example an incomplete parse-tree augmented in accordance with the methods of this invention.

Considering FIG. 4, note that a "Zilch", represented as a z, has been inserted between all non-adjacent pairs of child nodes in each generation of the tree. Also note that no code word assignments are made to any interior nodes, which is another feature of the methods of this invention. The incomplete parse-tree in FIG. 4 represents the entire modification to the parse-tree of FIG. 2 made in accordance with the methods of this invention, including the EOR symbol discussed above. FIGS. 5 and 6 show two other larger illustrative examples of incomplete parse trees modified according to the methods of this invention.

The Zilch holds the proper position of the code word string so that, when followed with the next source character, which appears as the first character down from the root of the tree, the code word string will retain the sort order according to the "strong alphabetical" property described by Gilbert et al in the above reference. That is, the longer code word strings composed of successive cycles on the incomplete parse-tree will also remain in alphabetical order. Gilbert et al did not consider the problem of missing children because they did not consider the extension of source alphabets.

With the addition of the EOR character, the reservation of the all-0's code word to the EOR character and the addition of a fictitious Zilch character to the source alphabet, the incomplete parse-tree can be converted to a parse-tree having sort-ordered leaf nodes that will generate code strings having magnitude order corresponding to the alphabetical sort order of the corresponding source strings. In the most general case, every node can have the EOR symbol as a child node, but adjacent EOR and Zilch nodes can be combined to form a single EOR node to reduce the necessary code space. Such a combination is illustrated as leaf node (1) in FIG. 4.

The parse-tree in FIG. 4 is developed from that in FIG. 2 as follows. In each case, an EOR or Zilch character is placed as the first child (left-most or lexically ordered) from each interior and root node. If the first-ordered symbol is present as a child node, then the left-most child is designated EOR. Otherwise, the left-most child is designated as a Zilch. Thus, to avoid the interior node EOR problem and the byte-padding problem, each interior node must have either a Zilch or an EOR node as its left-most child.

If two adjacent children in the incomplete parse-tree are assigned source symbols that are non-adjacent in the source alphabet, then these nodes must be separated by a new Zilch node.

Accordingly, the EOR node with code (0) is added as a root node child in FIG. 4. EOR Node (1) is added as a sibling to the left of leaf node AA for Code (2). Zilch Node (6) is added as a sibling to the left of leaf node CB for Code (7). Zilch Node (3) is added to separate non-adjacent children. Zilch Node (8) replaces a missing child at the right-most end of the generation. Note that Zilch Nodes (3) and (8) may just as well be replaced with the proper missing source symbol because no space is saved by doing otherwise.

For techniques where external data are used to inform the decoder when to stop decoding the code string, the EOR position exists but need not be encoded. However, if the record terminates in a word that is represented by an interior node that lacks some children, some means must be provided to inform the decoder that none of the child nodes are selected. Thus, some code space at the left of the left-most child of such a node must be reserved and might as well be reserved as an EOR node, which is the preferred embodiment of this method of this invention.

The following Table 2 provides a listing for the first 39 possible source strings using the 3-symbol source alphabet discussed in connection with FIGS. 3 and 4. Note that the parse-tree in FIG. 4 retains the "strong alphabetical" property. Of course, the fixed code work length is maintained by adding zero value symbols to the right-hand side of the code word (not shown).

TABLE 2

| Source String | Code FIG. 2 | Code FIG. 4 | Source String | Code FIG. 2 | Code FIG. 4 |
|---|---|---|---|---|---|
| A | 2 | 1 | BBB | 444 | 5550 |
| AA | 1 | 20 | BBC | 445 | 5560 |
| AAA | 12 | 21 | BC | 45 | 560 |
| AAB | 14 | 250 | BCA | 452 | 561 |
| AAC | 15 | 260 | BCB | 46 | 570 |

TABLE 2-continued

| Source String | Code FIG. 2 | Code FIG. 4 | Source String | Code FIG. 2 | Code FIG. 4 |
|---|---|---|---|---|---|
| AB | 24 | 350 | BCC | 455 | 5880 |
| ABA | 242 | 351 | C | 5 | 60 |
| ABB | 244 | 3550 | CA | 52 | 61 |
| ABC | 245 | 3560 | CAA | 51 | 620 |
| AC | 25 | 40 | CAB | 524 | 6350 |
| ACA | 252 | 41 | CAC | 53 | 640 |
| ACB | 26 | 450 | CB | 6 | 70 |
| ACC | 255 | 460 | CBA | 62 | 71 |
| B | 4 | 50 | CBB | 64 | 750 |
| BA | 42 | 51 | CBC | 65 | 760 |
| BAA | 41 | 520 | CC | 55 | 860 |
| BAB | 424 | 5350 | CCA | 552 | 861 |
| BAC | 43 | 540 | CCB | 56 | 870 |
| BB | 44 | 550 | CCC | 555 | 8860 |
| BBA | 442 | 551 | | | |

Obviously, other embodiments and modifications of this invention will occur readily to those of ordinary skill in the art in view of these teachings. Therefore, this invention is to be limited only by the following claims, which include all such obvious embodiments and modifications when viewed in conjunction with the above specifications and accompanying drawings.

We claim:

1. A computer-implemented method for the efficient sort-order preserving storage of a compressed said record, having a first string of source symbols selected from an ordered source alphabet, wherein each said source symbol corresponds to a string of at least one encoder symbols selected from an ordered encoder alphabet, said method comprising the unordered steps of:

encoding said record as a second string of said encoder symbols selected from said ordered encoder alphabet:

reserving the first said encoder symbol in said ordered encoder alphabet for exclusive use as an End-Of-Record (EOR) symbol or encoder symbol terminator in said second strings;

assigning a zero value to said first encoder symbol whereby said first encoder symbol may be appended to said second string of said encoder symbols without changing the value of said second string; and storing said second string of encoder symbols, whereby the sort order of a plurality of said second strings preserves the sort order of the corresponding records.

2. The method of claim 1 wherein said second string is augmented with one or more additional padding symbols necessary to fully occupy an integral number of bytes in a data storage medium.

3. The method of claim 2 wherein said additional padding symbols have a zero value such that their addition to said second string does not change the value of said second string.

4. A method for efficient sort-order preserving storage in a storage medium of a compressed record having a first string of source symbols selected from an ordered source alphabet, said method comprising the steps of:

establishing an ordered encoder dictionary containing one or more code words by performing the steps of:

defining a parse-tree having a plurality of child nodes ordered within each of one or more generations extending from a root node to a plurality of leaf nodes located in more than one said generations, assigning one said source symbol to each said child node such that all said child nodes are ordered within each said generation according to said ordered source alphabet and no said source symbol appears more than once in any generation, adding a marker child node within each said generation between each adjacent pair of said child nodes to which non-adjacent source symbols are assigned, adding a marker child node at the first ordered position within each said generation, assigning an EOR source symbol to every said marker child node located adjacent to a child node to which is assigned the first-ordered said source symbol in said source alphabet, and assigning a code word to each said leaf node in sequence according to the alphabetical sequence of said source symbols assigned to said leaf nodes;

encoding said record as a second string of said code words selected according to the correspondence required by the common leaf node assignments of said source symbols and said code words; and storing said second string in said storage medium as a uniquely decodable representation of said record.

5. The method of claim 4 wherein the first said code word in said ordered encoder dictionary comprises:

one or more zero symbols having zero value such that the addition of said first said code word to the end of said second string has no effect on the value of said second string.

6. The method of claim 5 wherein said storage medium comprises a byte-oriented storage means for storing records as a series of fixed-length bytes, comprising the additional step of:

adding one or more said zero symbols to the end of each said second string to pad out the last byte occupied by said second string in said storage medium.

7. The method of claim 6 wherein:

said code words are expressed as binary numbers of identical predetermined length.

* * * * *

UNITED STATES PATENT AND TRADEMARK OFFICE
CERTIFICATE OF CORRECTION

PATENT NO. : 5,270,712
DATED : December 14, 1993
INVENTOR(S) : Iyer et al

It is certified that error appears in the above-indentified patent and that said Letters Patent is hereby corrected as shown below:

Column 13, line 27, after "compressed", please insert --record,--; and

Line 28, please delete the comma.

Signed and Sealed this

Twenty-first Day of June, 1994

Attest:

BRUCE LEHMAN

*Attesting Officer*   *Commissioner of Patents and Trademarks*